(12) United States Patent
Fan et al.

(10) Patent No.: US 8,879,271 B2
(45) Date of Patent: Nov. 4, 2014

(54) SLIDE ASSEMBLY

(75) Inventors: Chen-Lu Fan, New Taipei (TW);
Jing-Chao Liang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 271 days.

(21) Appl. No.: 13/481,899

(22) Filed: May 28, 2012

(65) Prior Publication Data
US 2013/0016461 A1 Jan. 17, 2013

(30) Foreign Application Priority Data

Jul. 13, 2011 (CN) .......................... 2011 1 0195709

(51) Int. Cl.
*G06F 1/16* (2006.01)
*H05K 7/14* (2006.01)
(52) U.S. Cl.
CPC ................................... *H05K 7/1489* (2013.01)
USPC .................. 361/725; 361/679.33; 361/679.37
(58) Field of Classification Search
CPC .............................. G06F 1/187; H05K 7/1489
USPC ........................ 361/679.33, 679.37, 724–727
See application file for complete search history.

(56) References Cited

U.S. PATENT DOCUMENTS

| 6,171,120 | B1 * | 1/2001 | Bolich et al. | 439/157 |
|---|---|---|---|---|
| 6,625,014 | B1 * | 9/2003 | Tucker et al. | 361/679.34 |
| 6,874,223 | B2 * | 4/2005 | Reilley | 29/603.03 |
| 7,031,150 | B2 * | 4/2006 | Chen et al. | 361/679.33 |
| 7,068,502 | B2 * | 6/2006 | Chen et al. | 361/679.39 |
| 7,090,528 | B2 * | 8/2006 | Tuttle et al. | 439/383 |
| 7,102,885 | B2 * | 9/2006 | Chen et al. | 361/679.31 |
| 7,345,237 | B2 * | 3/2008 | Chen et al. | 174/50 |
| 7,450,376 | B2 * | 11/2008 | Chen et al. | 361/679.33 |
| 7,697,279 | B2 * | 4/2010 | Yeh et al. | 361/679.39 |
| 7,830,656 | B2 * | 11/2010 | Ding | 361/679.37 |
| 2004/0189163 | A1 * | 9/2004 | Liu et al. | 312/330.1 |
| 2006/0227502 | A1 * | 10/2006 | Cheng | 361/685 |
| 2008/0123280 | A1 * | 5/2008 | Chen et al. | 361/685 |
| 2008/0164795 | A1 * | 7/2008 | Peng et al. | 312/334.5 |
| 2009/0091882 | A1 * | 4/2009 | Liu et al. | 361/679.33 |
| 2013/0044416 | A1 * | 2/2013 | Fan | 361/679.01 |
| 2013/0070413 | A1 * | 3/2013 | Zhou | 361/679.33 |

* cited by examiner

*Primary Examiner* — Adrian S Wilson
(74) *Attorney, Agent, or Firm* — Novak Druce Connolly Bove + Quigg LLP

(57) ABSTRACT

A slide assembly for mounting an electronic device includes an inner slide, a fastening member mounted on the electronic device and a locking member with a distal end slidably mounted on the inner slide. A receiving slot is defined in the locking member. A mounting slice extends horizontally from the receiving slot toward the distal end of the locking member. The fastening member abuts the mounting slice to make the locking member elastically deform. The fastening member slides into the receiving slot. When the locking member elastically returns, the fastening member is restricted in the receiving slot by the mounting slice.

20 Claims, 5 Drawing Sheets

SLIDE ASSEMBLY

BACKGROUND

1. Technical Field

The present disclosure relates to a slide assembly for preventing an electronic device from falling off.

2. Description of Related Art

A three-section slide for a server unit includes an inner slide, an outer slide, and a third slide. A slide-aiding ball member is sandwiched between any two of the inner slide, the outer slide, and the third slide to enable a smooth sliding movement. The inner slide and the outer slide have a retaining member and a stop member mounted thereon respectively, for restricting movement. The retaining member is attached to an inner surface of the inner slide, and is provided with an engaging portion. The stop member is mounted to a front end of the outer slide, and is provided with a protrusion. When users draw out the inner slide from the outer slide, the protrusion of the stop member engages with the engaging portion of the retaining member to prevent accidental disassembly.

However, a user's hand may be caught and injured by the inner slide and the outer slide when the user directly disengages the engaging portion from the stop member to let the inner slide retract into the outer slide. Therefore, it may be inconvenient and dangerous for users to operate the slide.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
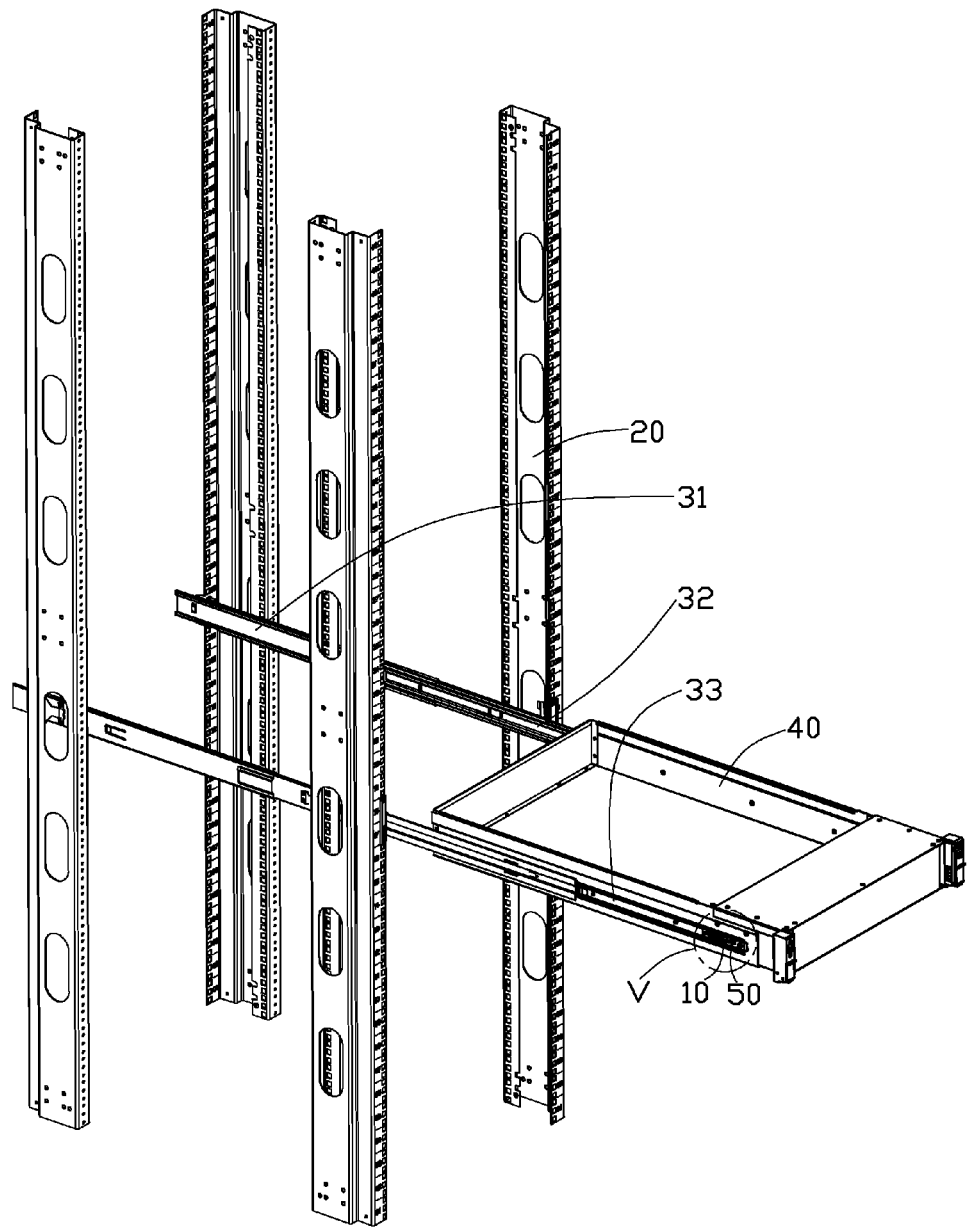
FIG. 1 is an assembly view of an embodiment of a slide assembly for mounting an electronic device, the slide assembly including a locking member, an outer slide, a middle slide, an inner slide and a fastening member.
Figure 2:
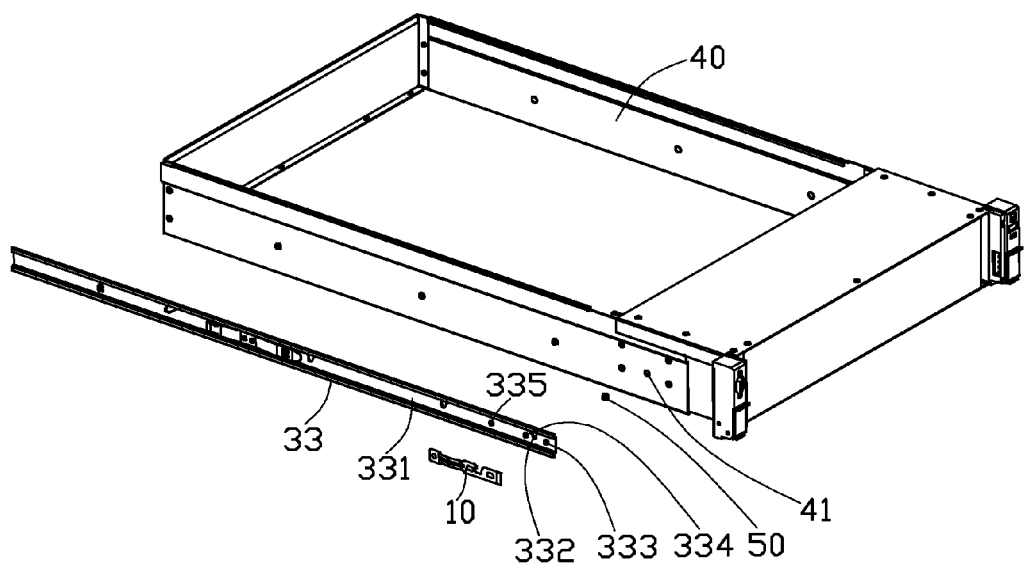
FIG. 2 is an exploded, isometric view of the locking member, the outer slide, the middle slide, the inner slide, the fastening member and the electronic device of FIG. 1.
Figure 3:
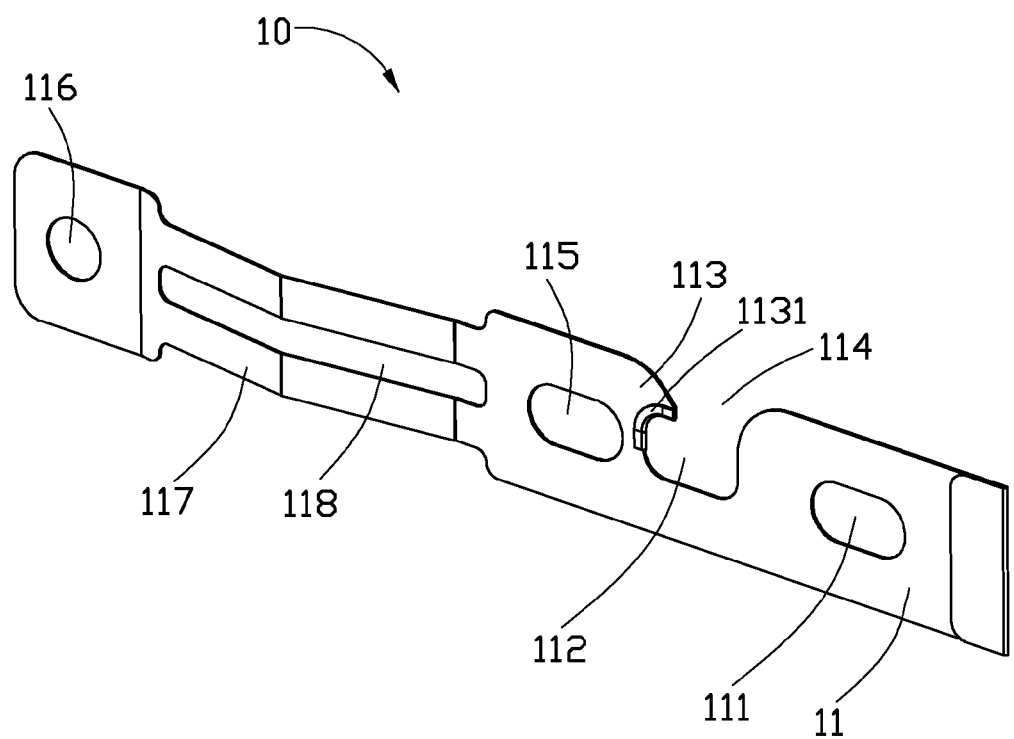
FIG. 3 is an isometric view of the locking slice of FIG. 2.

Referring to FIGS. 1 to 3, a slide assembly in accordance with an embodiment, configured for mounting an electronic device 40, includes a locking member 10, an outer slide 31, a middle slide 32 mounted on the outer slide 31, an inner slide 33 mounted on the middle slide 32, and a fastening member 50 mounted on the electronic device 40. A fixing slot 331 is defined in the inner slide 33 for receiving the locking member 10. A locating slot 332 is defined in the inner slide 33 corresponding to the fastening member 50. A circular fixing hole 41 is defined in the electronic device 40 for receiving the fastening member 50.

The locking member 10 includes a locking slice 11. A rod-shaped first sliding slot 111 is defined in a first distal end of the locking slice 11. A receiving slot 112 is defined in the locking slice 11 adjacent to the first sliding slot 111. A mounting slice 113 extends horizontally from the receiving slot 112 toward the first distal end of the locking slice 11. A trapezoid-shaped opening 114 is defined in a top of the receiving slot 112. An outer side of the mounting slice 113 is arc-shaped. An arc-shaped protrusion portion 1131 is formed on an inner side of the mounting slice 113. A rod-shaped second sliding slot 115 is defined in the locking slice 11 adjacent to the receiving slot 112. A circular mounting slot 116 is defined in a second distal end of the locking slice 11. An elastic slice 117 is formed between the second sliding slot 115 and the mounting slot 116. A rod-shaped connecting slot 118 is defined in the elastic slice 117. In one embodiment, a width of the elastic slice 117 is less than a width of the first distal end and the second distal end of the locking slice 11.

A column-shaped first guiding portion 333 is formed on the fixing slot 331 corresponding to the first sliding slot 111. A column-shaped second guiding portion 334 is formed on the fixing slot 331 corresponding to the second sliding slot 115. A column-shaped mounting portion 335 is formed on the fixing slot 331 corresponding to the mounting slot 116. In one embodiment, a width of the first sliding slot 111 is equal to a dimension of the first guiding portion 333; a width of the second sliding slot 115 is equal to a dimension of the second guiding portion 334; and a dimension of the mounting slot 116 is equal to a dimension of the mounting portion 335.

Figure 4:
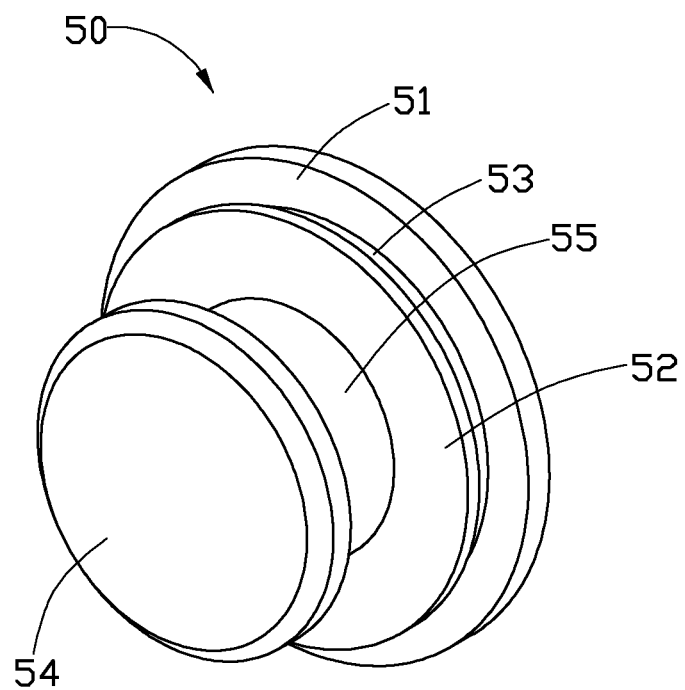
FIG. 4 is an isometric view of the fastening member of FIG. 2.

Referring to FIG. 4, the fastening member 50 includes a disc-shaped first locating portion 51, a disc-shaped second locating portion 52, a column-shaped first connecting portion 53 between the first locating portion 51 and the second locating portion 52, a disc-shaped fixing portion 54, and a column-shaped second connecting portion 55 between the second locating portion 52 and the fixing portion 54. The second locating portion 52 is received in the fixing hole 41. The fixing portion 54 and the second connecting portion 55 pass through the fixing hole 41 and extend to an outside of the electronic device 40. The first locating portion 51 abuts an inner surface of the electronic device 40. In one embodiment, a dimension of the first locating portion 51 is greater than a dimension of the fixing hole 41; a dimension of the second locating portion 52 is equal to a dimension of the fixing hole 41; a dimension of the fixing portion 54 is less than a width on a top of the locating slot 332; a dimension of the fixing portion 54 is greater than a width on a bottom of the locating slot 332; and a radius of the fixing portion 54 is equal to a length of the protrusion portion 1131 in the horizontal direction.

Figure 5:
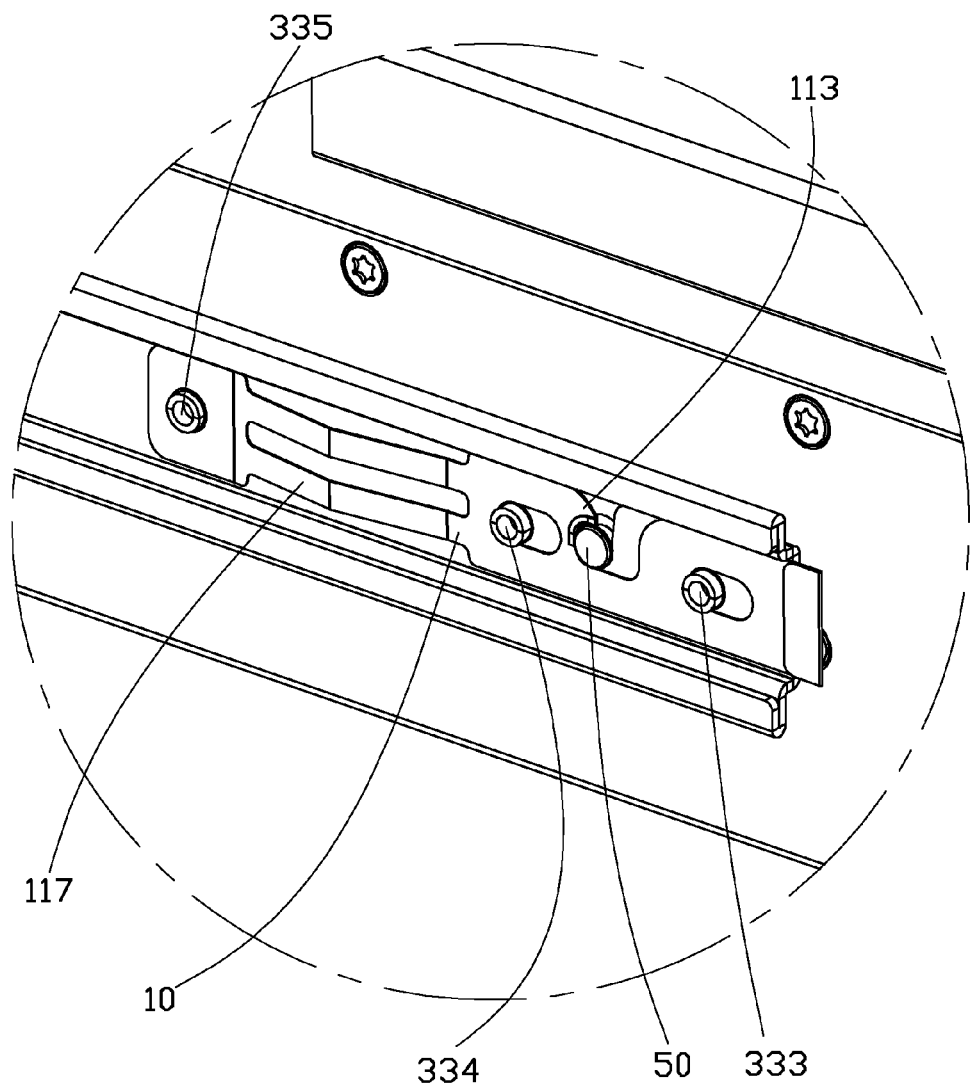
FIG. 5 is an enlarged view of a circled portion V of FIG. 1.

Referring to FIG. 5, in assembly, the mounting portion 335 passes through the mounting slot 116 to mount the second distal end of the locking slice 11 on the inner slide 33. The first distal end of the locking slice 11 is pressed toward the mounting portion 335 in the horizontal direction. The elastic slice 117 elastically deforms. To align the first guiding portion 333 with the first sliding slot 111, the first guiding portion 333 passes through and is slidably received in the first sliding slot 111. To align the second guiding portion 334 with the second sliding slot 115, the second guiding portion 334 passes through and is slidably received in the second sliding slot 115. The first guiding portion 333 abuts a left side of the first sliding slot 111. The second guiding portion 334 abuts a left side of the second sliding slot 115. The locking slice 11 is mounted in the fixing slot 331. The elastic slice 117 elastically deforms slightly to an original state.

When the electronic device 40 is mounted on the inner slide 33, the fastening member 50 is moved toward the opening 114. The second connecting portion 55 downwardly abuts the outer side of the mounting slice 113. The first distal end of the locking slice 11 moves toward the mounting portion 335 in the horizontal direction. The first guiding portion 333 slides in the first sliding slot 111. The second guiding portion 334 slides in the second sliding slot 115. The elastic slice 117 elastically deforms. When the second connecting portion 55 does not abut the outer side of the mounting slice 113 and is slide into the receiving slot 112, the first distal end of the locking slice 11 moves away from the mounting portion 335 in the horizontal direction. The elastic slice 117 elastically returns to the original state. The first guiding portion 333 slides in the first sliding slot 111 until the first guiding portion 333 abuts the left side of the first sliding slot 111. The second guiding portion 334 slides in the second sliding slot 115 until the second guiding portion 334 abuts the left side of the second sliding slot 115. A lower edge of the second connecting portion 55 abuts the bottom of the locating slot 332. A top edge of the second connecting portion 55 abuts the protrusion portion 1131. The fastening member 50 is mounted in the receiving slot 112 and the electronic device 40 is mounted on the inner slide 33.

When the electronic device 40 is released from the inner slide 33, the first distal end of the locking slice 11 is pulled to move toward the mounting portion 335 in the horizontal direction. The first guiding portion 333 slides in the first sliding slot 111. The second guiding portion 334 slides in the second sliding slot 115. The elastic slice 117 elastically deforms until the mounting slice 113 no longer abuts the second connecting portion 55. The electronic device 40 is released from the inner slide 33.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A slide assembly for mounting an electronic device, comprising:
    an inner slide;
    a fastening member mounted on the electronic device; and
    a locking member with a distal end slidably mounted on the inner slide; a receiving slot is defined in the locking member; a mounting slice extends horizontally from the receiving slot toward the distal end of the locking member; wherein the fastening member abuts the mounting slice to elastically deform the locking member; the fastening member slides into the receiving slot; and when the locking member elastically returns, the fastening member is restricted in the receiving slot by the mounting slice.

2. The slide assembly of claim 1, wherein a locating slot is defined in the inner slide corresponding to the fastening member; and the fastening member passes through the locating slot to mount in the receiving slot.

3. The slide assembly of claim 1, wherein the locking member comprises a locking slice; a rod-shaped first sliding slot is defined in a first distal end of the locking slice adjacent to the receiving slot; a column-shaped first guiding portion is formed on the inner slide corresponding to the first sliding slot; and the first guiding portion slides in the first sliding slot when the fastening member abuts the mounting slice.

4. The slide assembly of claim 3, wherein a circular mounting slot is defined in a second distal end of the locking slice; a column-shaped mounting portion is formed on the inner slide corresponding to the mounting slot; and the mounting portion passes through the mounting slot to mount the second distal end of the locking slice on the inner slide.

5. The slide assembly of claim 4, wherein a width of the first sliding slot is equal to a first dimension of the first guiding portion; and a second dimension of the mounting slot is equal to a third dimension of the mounting portion.

6. The slide assembly of claim 4, wherein an elastic slice is formed between the receiving slot and the mounting slot; and the elastic slice elastically deforms when the fastening member abuts the mounting slice.

7. The slide assembly of claim 6, wherein a rod-shaped connecting slot is defined in the elastic slice; and a width of the elastic slice is less than a width of the first distal end and a width of the second distal end of the locking slice.

8. The slide assembly of claim 6, wherein a rod-shaped second sliding slot is defined in the locking slice between the receiving slot and the elastic slice; a column-shaped second guiding portion is formed on the inner slide corresponding to the second sliding slot; and the second guiding portion slides in the second sliding slot when the fastening member abuts the mounting slice.

9. The slide assembly of claim 8, wherein an outer side of the mounting slice is arc-shaped; an arc-shaped protrusion portion is formed on an inner side of the mounting slice; and the fastening member abuts the protrusion portion when the fastening member is being restricted in the receiving slot.

10. The slide assembly of claim 9, wherein the fastening member is circular; and a radius of the fastening member is equal to a length of the protrusion portion in a horizontal direction.

11. A slide assembly, comprising:
    an inner slide;
    an electronic device comprising a fastening member mounted thereon; and
    a locking member with a distal end slidably mounted on the inner slide; a receiving slot is defined in the locking member; a mounting slice extends horizontally from the receiving slot toward the distal end of the locking member; wherein the fastening member abuts the mounting slice to elastically deform the locking member; the fastening member slides into the receiving slot; and when the locking member elastically returns, the fastening member is restricted in the receiving slot by the mounting slice.

12. The slide assembly of claim 11, wherein a locating slot is defined in the inner slide corresponding to the fastening member; and the fastening member passes through the locating slot to mount in the receiving slot.

13. The slide assembly of claim 11, wherein the locking member comprises a locking slice; a rod-shaped first sliding slot is defined in a first distal end of the locking slice adjacent to the receiving slot; a column-shaped first guiding portion is formed on the inner slide corresponding to the first sliding slot; and the first guiding portion slides in the first sliding slot when the fastening member abuts the mounting slice.

14. The slide assembly of claim 13, wherein a circular mounting slot is defined in a second distal end of the locking slice; a column-shaped mounting portion is formed on the inner slide corresponding to the mounting slot; and the mounting portion passes through the mounting slot to mount the second distal end of the locking slice on the inner slide.

15. The slide assembly of claim 14, wherein a width of the first sliding slot is equal to a first dimension of the first guiding portion; and a second dimension of the mounting slot is equal to a third dimension of the mounting portion.

16. The slide assembly of claim 14, wherein an elastic slice is formed between the receiving slot and the mounting slot; and the elastic slice elastically deforms when the fastening member abuts the mounting slice.

17. The slide assembly of claim 16, wherein a rod-shaped connecting slot is defined in the elastic slice; and a width of the elastic slice is less than a width of the first distal end and a width of the second distal end of the locking slice.

18. The slide assembly of claim 16, wherein a rod-shaped second sliding slot is defined in the locking slice between the receiving slot and the elastic slice; a column-shaped second guiding portion is formed on the inner slide corresponding to the second sliding slot; and the second guiding portion slides in the second sliding slot when the fastening member abuts the mounting slice.

19. The slide assembly of claim 18, wherein an outer side of the mounting slice is arc-shaped; an arc-shaped protrusion portion is formed on an inner side of the mounting slice; and the fastening member abuts the protrusion portion when the fastening member is being restricted in the receiving slot.

20. The slide assembly of claim 19, wherein the fastening member is circular; and a radius of the fastening member is equal to a length of the protrusion portion in a horizontal direction.

\* \* \* \* \*